(12) United States Patent
Das et al.

(10) Patent No.: US 8,143,530 B1
(45) Date of Patent: Mar. 27, 2012

(54) LIQUID CRYSTAL POLYMER LAYER FOR ENCAPSULATION AND IMPROVED HERMITICITY OF CIRCUITIZED SUBSTRATES

(75) Inventors: Rabindra N. Das, Vestal, NY (US); Michael Rowlands, Naperville, IL (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 12/884,392

(22) Filed: Sep. 17, 2010

(51) Int. Cl.
*H05K 1/03* (2006.01)
(52) U.S. Cl. ......... 174/256; 174/255; 174/257; 174/250
(58) Field of Classification Search .......... 174/250, 174/255–258
See application file for complete search history.

(56) References Cited

U.S. PATENT DOCUMENTS

| | | | |
|---|---|---|---|
| 6,602,583 B2* | 8/2003 | St. Lawrence et al. | 428/209 |
| 6,703,114 B1* | 3/2004 | Guiles et al. | 428/209 |
| 6,982,480 B2 | 1/2006 | Shi | |
| 7,018,705 B2* | 3/2006 | Nakatani et al. | 428/209 |
| 7,114,312 B2 | 10/2006 | Coppeta et al. | |
| 7,790,268 B2* | 9/2010 | Kennedy | 428/209 |
| 2005/0099783 A1* | 5/2005 | Alcoe et al. | 361/748 |
| 2005/0100719 A1* | 5/2005 | Kanakarajan et al. | 428/209 |
| 2009/0008141 A1* | 1/2009 | Nakamura et al. | 174/260 |

* cited by examiner

*Primary Examiner* — Hoa C Nguyen
(74) *Attorney, Agent, or Firm* — Mark Levy; Hinman, Howard & Kattell, LLP

(57) ABSTRACT

A substrate and method for making same for use in electronic packages having a core layer of copper-invar-copper (CIC) with a layer of polytetrafluoroethylene (PTFE) placed upon both sides of the CIC. A layer of etched copper foil is placed on the outer surface of each PTFE layer. A layer of liquid crystal polymer (LCP) is placed on both layers of etched copper foil. An external layer of etched copper foil is placed on the external surface of the LCP layers.

10 Claims, 13 Drawing Sheets

LIQUID CRYSTAL POLYMER LAYER FOR ENCAPSULATION AND IMPROVED HERMITICITY OF CIRCUITIZED SUBSTRATES

FIELD OF THE INVENTION

The present invention relates to manufacturing and preparation of circuit boards and, more specifically, to a structure wherein liquid crystal polymer (LCP) is utilized as a layer in a substrate and as a near hermetically sealing encapsulation layer.

BACKGROUND OF THE INVENTION

The needs of the semiconductor marketplace continue to drive density into semiconductor packages. The high end of this market appears to be standard Application-Specific Integrated Circuits (ASICs), structured ASICs, and Field-Programmable Gate Arrays (FPGAs). These devices continue to need increasing signal, power, and ground die pads. A corresponding decrease in pad pitch is required to maintain reasonable die sizes. The combination of these two needs is pushing complex semiconductor packaging designs.

Traditionally, greater wiring densities are achieved by reducing the dimensions of vias, lines, and spaces, increasing the number of wiring layers, and utilizing blind and buried vias. However, each of these approaches possesses inherent limitations, for example those related to drilling and plating of high aspect ratio vias, reduced conductance of narrow circuit lines, and increased cost of fabrication related to additional wiring layers. One method of extending wiring density beyond the limits imposed by these approaches is a strategy that allows for metal-to-metal z-axis interconnection of sub-composites during lamination to form a composite structure.

Conductive joints can be formed during lamination using an electrically conductive adhesive. As a result, one is able to fabricate structures with vertically terminated vias of arbitrary depth. Replacement of conventional plated through holes with vertically-terminated vias opens up additional wiring channels on layers above and below the terminated vias and eliminates via stubs which cause reflective signal loss. More and more substrate designs require signal paths that can handle frequencies on the order of multi-gigahertz.

The challenges for organic substrates in meeting these electrical requirements include using high-speed, low-loss materials, manufacturing precise structures, and making a reliable finished product. In addition, many high-speed chip packages have mechanical and environmental requirements such as light weight and low moisture absorption. One material that meets all of these requirements is a liquid crystal polymer (LCP) dielectric that has a unique combination of features and performance. Due to its design flexibility, lighter weight and especially hermiticity, LCP-based Z-interconnect has potential to be a favorable alternative to low temperature co-fired ceramic (LTCC) substrates. In addition, the lower dielectric constant of LCPs can reduce crosstalk and noise coupling compared to LTCC substrates.

Electronic substrates require hermetic or near hermetic seals to reduce loss and to protect circuits in harsh environments. Any water that is absorbed by substrates increases the signal loss in that substrate, especially at GHz frequencies. Also, any circuit in an environment with much water or dust or dirt, should be sealed from these outside debris in order to continue functioning.

Currently, most hermetic seals are using machined metal enclosures. Using LCPs to seal a substrate results in orders of magnitude lighter weight and less expense than metal enclosures. In addition, LCP material can be part of the processing of the electronics, rather than an additional assembly step. This reduces the cost and complexity of assembly even further.

DISCUSSION OF RELATED ART

U.S. Pat. No. 7,114,312, by Coppeta, et al granted Oct. 3, 2006 for LOW TEMPERATURE METHODS FOR HERMETICALLY SEALING RESERVOIR DEVICES discloses a method for hermetically sealing an opening in a reservoir of a containment device. The method comprises applying a polymeric material to an opening in a reservoir of a containment device, the reservoir comprising reservoir contents (such as a drug or a sensor) to be hermetically isolated within the reservoir, the applied polymeric material closing off the opening and forming a temporary seal; and adhering a hermetic sealing material onto the polymeric material to hermetically seal the opening. The reservoir can be a microreservoir. The containment device can comprise an array of two or more of reservoirs, and the method comprises hermetically sealing each of the two or more reservoirs.

U.S. Pat. No. 6,982,480 by Shi granted Jan. 3, 2006 for NEAR HERMETIC PACKAGING OF GALLIUM ARSENIDE SEMICONDUCTOR DEVICES AND MANUFACTURING METHOD THEREFOR discloses a near-hermetic microwave semiconductor device suitable for wideband high frequency applications including Phased Array Antenna systems. A PWB is a substrate; a GaAs Monolithic Microwave Integrated Circuit (MMIC) is disposed on the substrate; a silicon carbide sealant is disposed on the MMIC; and a Backside Interconnect with solder attachment connects the substrate to the silicon carbide-coated MMIC. A conformal coating is disposed on the sealant, and a cover is disposed on the conformally-coated MMIC.

SUMMARY OF THE INVENTION

According to the present invention, there is provided a method and structure of hermetically or near hermetically sealing a plurality of card structures. Optionally, a substrate for use in a printed circuit board has a liquid crystal polymer buildup layer.

A first aspect of the invention is directed to adding a build-up layer on top and/or bottom of any substrate to improve hermeticity of the substrate.

A second aspect of the invention is directed to adding a soldermask-like layer on top and/or bottom of a substrate to improve the hermeticity thereof.

A third aspect of the invention is directed to adding a soldermask-like layer on top and/or bottom of an all-LCP substrate, creating a near-hermetic substrate.

A fourth aspect of the invention is directed to adding a custom-carved LCP sheet on top and/or bottom of any substrate, creating a near-hermetic substrate.

A fifth aspect of the invention is directed to adding a custom-carved LCP sheet on top and/or bottom of an all-LCP substrate, creating a hermetic substrate.

A sixth aspect of the invention is directed to adding a custom-carved copper-clad LCP lid on top and/or bottom of any substrate, creating a near-hermetic, electromagnetic interference (EMI)-shielded substrate.

A seventh aspect of the invention is directed to adding a custom-carved, copper-clad LCP lid on top and/or bottom of an all-LCP substrate, creating a hermetic, EMI-shielded substrate.

An eighth aspect of the invention is directed to using an external LCP layer as a core that is produced with high temperature melting and/or low temperature melting LCP.

A ninth aspect of the invention is directed to using an external LCP layer as core that is produced with embedded resistors.

A tenth aspect of the invention is directed to using an external LCP layer that can be electrically conductive containing an adhesive filled core.

An eleventh aspect of the invention is directed to an external LCP layer that can be a nanoparticle and/or a microparticle filled core.

A twelfth aspect of the invention is directed to an external LCP layer that can be simultaneously used for through hole and/or micro via filling.

Another aspect of the invention is that the external LCP layer can be larger than the substrate to allow for a flexible panel edge.

Liquid crystal polymer (LCP) materials have a number of electrical properties compatible with transmission of signals at multi-GHz frequencies, including low moisture absorption and low electrical loss. These properties make LCP a good material for encapsulating electronic substrates and greatly improving the substrates' hermeticity.

This invention describes designs/structures and a manufacturing process of LCP external layers on a substrate where an external LCP material layer encapsulates and improves hermeticity of the electronic substrate or module. External LCP layers can be a part of a package or can be a protecting solder mask layer.

In order to seal the substrate, LCP can have shapes cut in the material, or cavities made within the material; or drilled LCP can be used. In addition, for best shielding, a solid copper plane with vias stitched along the edge is designed into the substrate and LCP cap assembly.

BRIEF DESCRIPTION OF THE DRAWINGS

These and other features and advantages of this invention will be more readily understood from the following detailed description of the various aspects of the invention taken in conjunction with the accompanying drawings in which.

DESCRIPTION OF THE PREFERRED EMBODIMENT

In the invention, a method and structure are provided for a substrate for use in electronic packages in which a liquid crystal polymer (LCP) is used to create a near hermetic package.

Figure 1A:
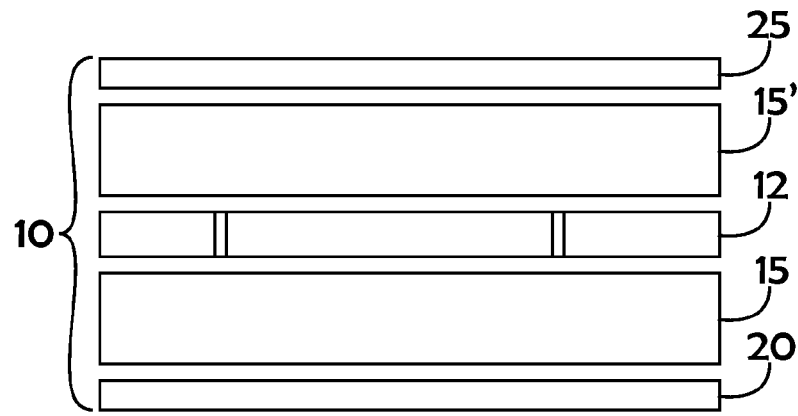
FIGS. 1a-e show a sectional view illustrating the steps to form a core member according to one embodiment of the present invention.

Referring now to the drawings and, for the present, to FIGS. 1a-e, the successive steps are shown in forming a core member 10 for use in forming a printed wiring board according to one embodiment of the invention. As can be seen in FIG. 1a, the core member 10 includes two dielectric substrates 15 and 15' that combine to cover the CIC (copper-invar-copper) layer 12. It is also possible to use layer 12 as a pure or treated copper and associated alloys. The dielectric substrates 15 and 15' have layers of metal coatings 20 and 25 on opposite faces thereof. Dielectric substrates 15 and 15' can be any conventional dielectric, such as FR4 (a glass reinforced epoxy), polyimide, polytetrafluoroethylene or other suitable well-known dielectric. In the embodiment shown in FIGS. 1a-e, the metal coatings 20 and 25 preferably are copper; typically, the layers are either one-half ounce copper (17.5 µm thick), one ounce copper (35 µm thick) or two ounce copper (70 µm thick). However, other thicknesses of copper coatings can be used. The copper coating can be a laminated foil or it can be plated on.

Figure 1B:
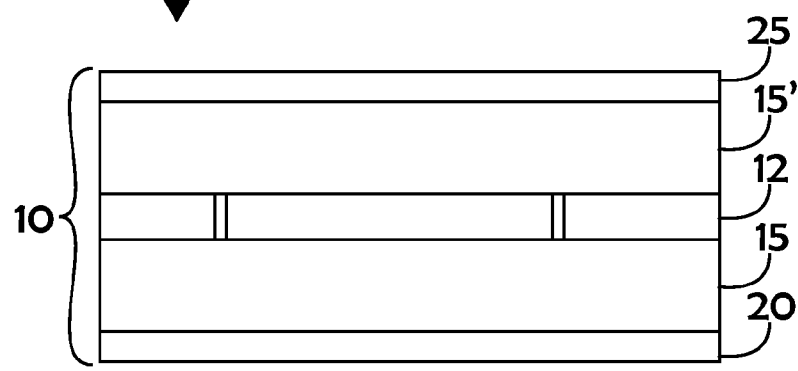

As shown in FIG. 1b, the board originally shown in FIG. 1a is laminated to produce core member 10.

Figure 1C:
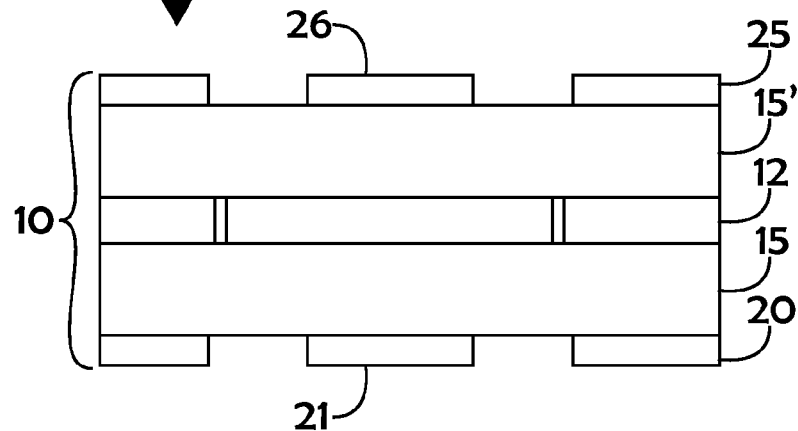

As shown in FIG. 1c, the copper layer 20 is preferably patterned to form circuit traces 21 and the copper layer 25 is patterned to form circuit traces 26. Any conventional patterning process can be used, such as by using a photoresist, exposing, developing and etching the exposed areas and then stripping the photoresist.

Figure 1D:
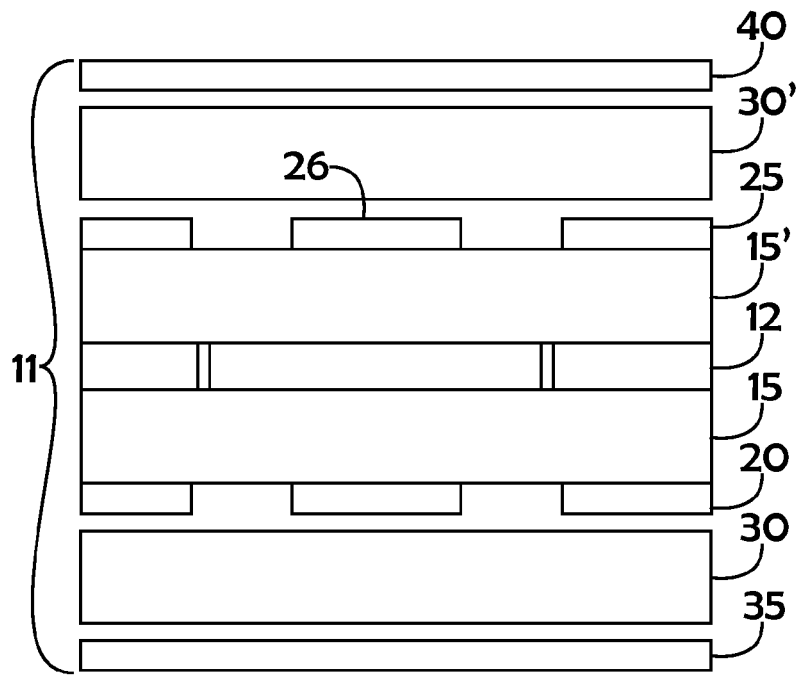

As shown in FIG. 1d, a layer in the form of liquid crystal polymer 30 and 30' is applied over the circuit traces 21 and 26, respectively. The metal coatings 35 and 40 applied to the LCP 30, 30' preferably are copper and, typically, layer 35, 40 is one-half ounce copper (17.5 µm thick), one ounce copper (35 µm thick) or two ounce copper (70 µm thick).

Figure 1E:
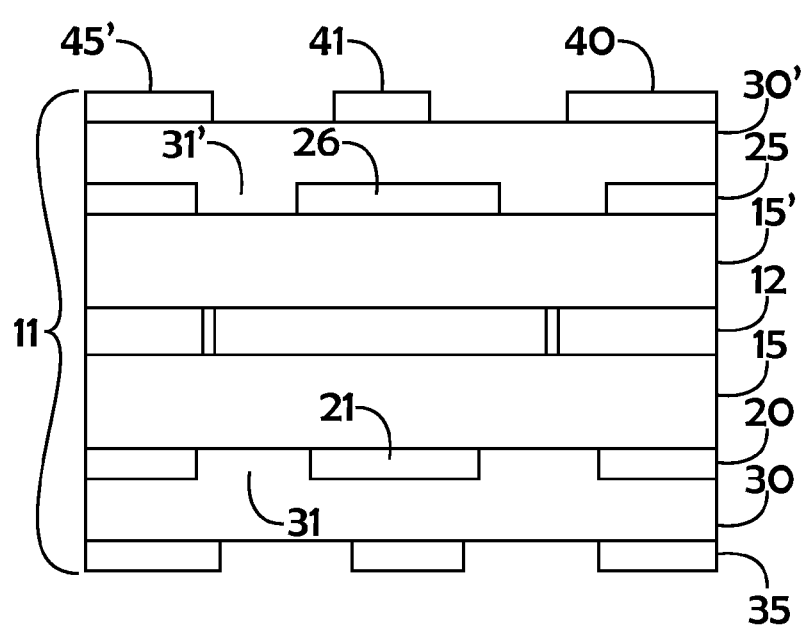

FIG. 1e shows the stack-up of FIG. 1d after lamination and etching. The LCP layers, 30, 30', are shown to have filled the void in metal layers 20, 25, respectively, indicated by numerals 31 and 31'. Also, coatings 35 and 40 are patterned to form circuit traces 36 and 41 in the metal coating, respectively, allow for component placement on the outer surface 45 and 45' in the present embodiment. This described arrangement of board layers allows improved hermeticity of the circuit board 11 without the use of auxiliary encapsulation methods (not shown) or external cabinets or enclosures to shield the board from contaminants.

Alternatively, LCP layers 30 and 30' can be laminated with copper layer 40 and 35 prior to a final lamination step, with the structure shown in FIG. 1c. In so doing, FIG. 1c can be referred to as a sub-composite assembly. It is also possible to laminate LCP layers 30 and 30' with a copper layer 40 and 35, and subsequently etch and circuitize the copper layer. A circuitized LCP layer can then be laminated with the sub-composite core member 10 described hereinabove.

An additional alternative is to have the circuitized LCP layer larger than the sub-composite core member 10 as shown in the FIG. 1c structure. The overhang of the LCP layer will remain as free-standing flexible layer. For example, if the sub-composite is square or a rectangle, the LCP layer 30 and 30' can be larger on one or more sides. For a circular or oval shaped sub-composite, the LCP layer 30 and 30' can be larger in one or more directions than the underlying sub-composite.

Figure 2:
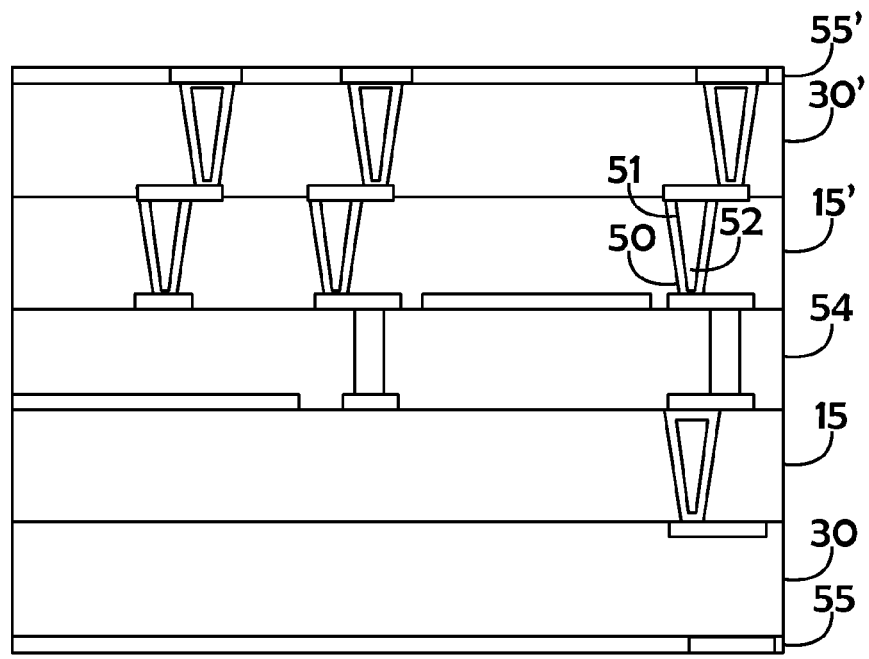
FIG. 2 shows the laminating structure of layer members to form a printed wiring board according to one embodiment of the invention.

Now referring to FIG. 2 there is shown another embodiment of the invention that uses vias 50 that are plated 51 with electrically conductive material such as copper. Screening, stenciling, flood coating, doctor blading, immersing or injecting fills these vias 50 with electrically conductive adhesives/paste (ECA) 52. Various types of conductive material may be used. A preferred conductive polymer material is a conductive epoxy sold by National Starch and Chemical Company under the trademark "Ablebond 8175," formerly sold by Ablestik Corporation. "Ablebond 8175" is a silver filled thermosetting epoxy. This embodiment substitutes the CIC layer 12 of FIG. 1a with other film type adhesive dielectric layers, including materials such as Rogers 2800 silica filled polytetrafluoroethylene 54. The use of vias 50 allows for the Z-interconnection of circuits from the lower surface 55 to the upper surface 55', utilizing the vias 50 and traces 53 etched into the copper plating, thereby keeping the interconnect circuitry fully contained and hermetically sealed within the board itself.

It is also possible to bond multiple sub-composites (FIG. 1c) with an LCP layer. Sub-composites can be made with different dielectrics as required by the end use of the laminate. In one embodiment, the top and bottom sub-composites 15 and 15' of FIG. 1c are made of LCP, and other sub-composites are made of a different dielectric. For example, the top and bottom sub-composites can be made with a high and/or low temperature melting LCP, an example of such is Rogers LCP bond ply. For high temperature melting LCP sub-composites and/or a mixture of high and low temperature melting LCP substrates, it is necessary that another layer of low temperature melting LCP layer be placed on the high temperature LCP side of sub-composites to allow proper bonding with other sub-composites. An external low temperature melt LCP surface does not require an additional LCP layer to bond with other non-LCP sub-composites.

Another option is to use larger top and/or bottom LCP sub-composites than the internal sub-composites. Conversely, any internal sub-composites, if made with pure LCP, can be larger and extend outside of the perimeter of external layers.

Joining multiple sub-composites as in FIG. 1c can be accomplished by laminating the dielectric layers, or by using a conductive paste filled dielectric layer. It is also possible to use a paste filled multiple dielectric and/or metal layers for joining multiple sub-composites.

Figure 3A:
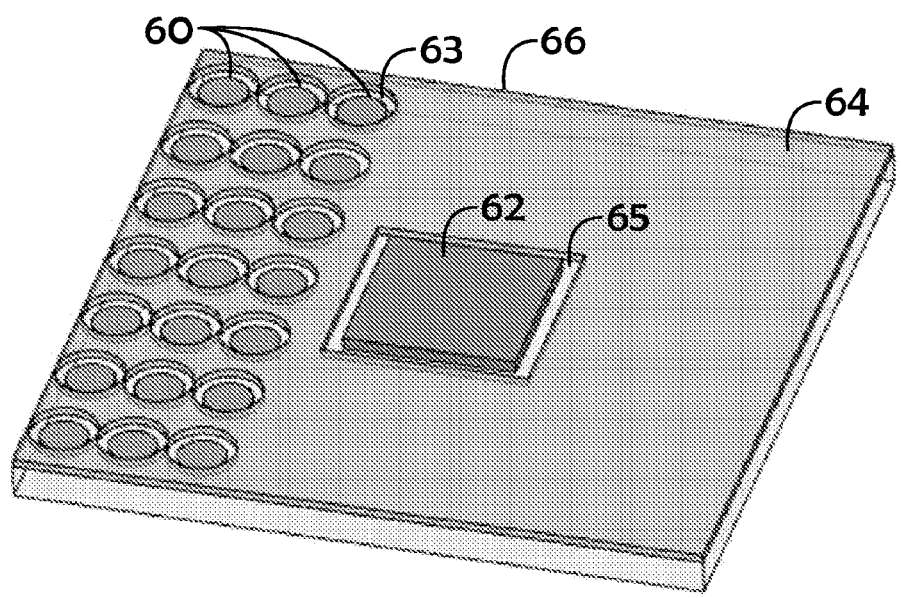
FIGS. 3a-c shows a perspective view of various embodiments of the present invention.
Figure 3B:
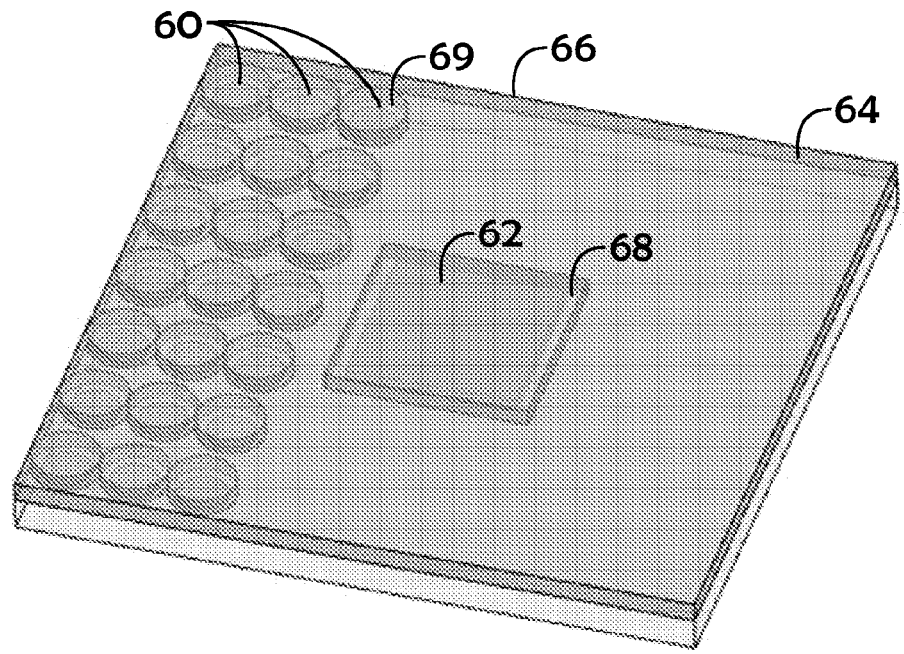
Figure 3C:
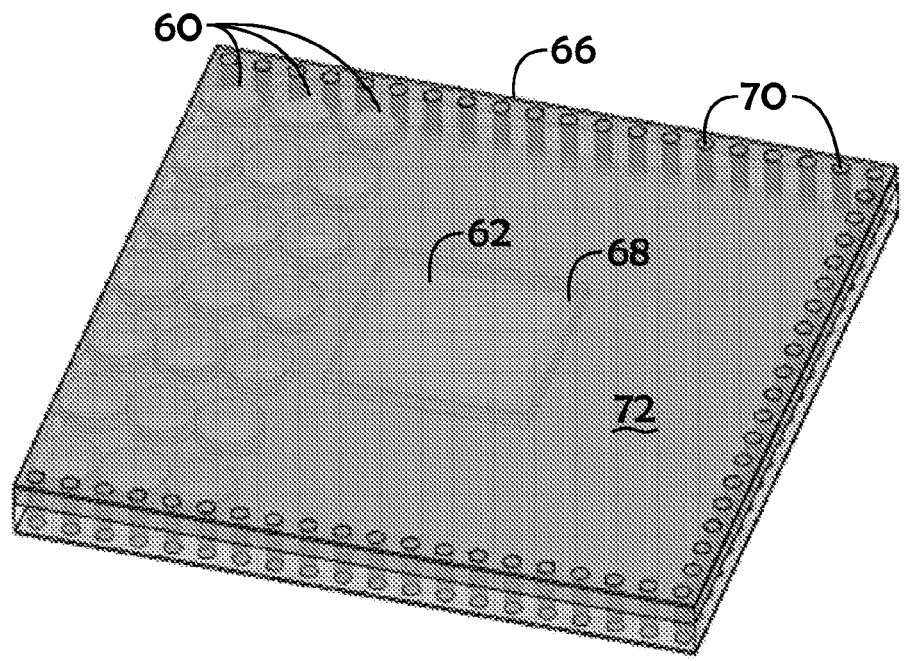

FIGS. 3a-c show and describe different embodiments of the current invention. FIG. 3a shows electronic components 60 and 62 disposed upon a circuit board 66 with an LCP layer 64 having cutouts 63 and 65 used as a solder mask to prevent solder from bridging between conductors, thereby preventing short circuits.

FIG. 3b is similar to FIG. 3a, wherein the LCP layer 64 contains carved out regions 68 and 69 where a portion of the LCP material has been removed to allow full encapsulation of the electronic components 60 and 62 disposed upon circuit board 66 after lamination. FIG. 3c shows what a next step to FIG. 3b may be, wherein the electronic components 60 and 62 encapsulated by LCP layer 64 have a copper layer 72 applied to the LCP layer 64, and vias 70 stitched along the edge of the circuit board 66 for EMI shielding.

An electrically conductive adhesives/paste (ECA) is used for through hole fill applications to fabricate Z-axis interconnections in the structures. Conductive joints are formed during composite lamination using the ECA process, and Z-axis interconnections are achieved using joining cores, that is, cores with no signal planes, but incorporating a thermoplastic or uncured thermoset dielectric material for the purpose of dielectric to dielectric joining, and ECA-filled vias for the purpose of metal-to-metal joining with adjacent signal cores. Approximately 5,000 to 200,000 through holes in the joining cores can be formed by laser or mechanical drilling and are filled with an optimized ECA. The adhesive-filled joining cores are then laminated with circuitized sub-composites to produce a composite structure. High temperature and pressure lamination is used to cure the adhesive in the composite structure and provide Z-interconnection among the circuitized sub-composites. The cores can be structured to contain a variety of arrangements of signal, voltage, and ground planes and in addition, the signal, voltage, and ground features can reside in the same plane.

Figure 4A:
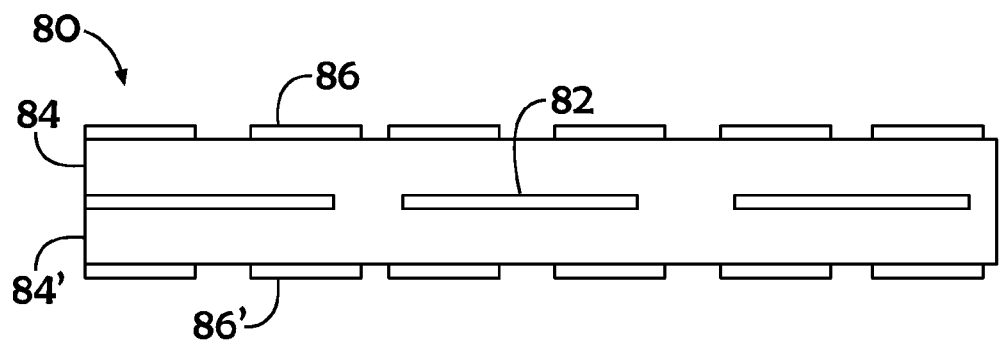
FIGS. 4a-b shows the laminating structure of layer members to form a printed wiring board according to one embodiment of the invention

Integral to the methodology described in this process is the use of core building blocks that can be laminated in such a manner that electrical interconnection between adjacent cores is achieved. As an example, the z-interconnection methodology was used to fabricate a package and two basic building blocks are used in this case study example. The first building block is a 2S/1P core 80 as shown in FIG. 4a. The power plane 82, a 35 µm thick copper foil, is sandwiched between two layers of a dielectric 84, 84'. The dielectric is used because of its favorable electrical, mechanical, and thermal properties. The signal layers 86 and 86' are comprised of copper features generated using a subtractive process. In one example, a line thickness of 35 µm is achieved with minimum dimensions for the line width and spacing of 75 µm each. Minimum land-to-line spacing was also 75 µm. Mechanically drilled through vias had a diameter of 200 µm. The diameter of plated pads around the through vias was 300 µm. In one embodiment, signal layers 86 and 86' of copper of the 2S/1P core 80 can be replaced by resistor foil. Resistor foil can be etched to get required sheet resistance.

Figure 4B:
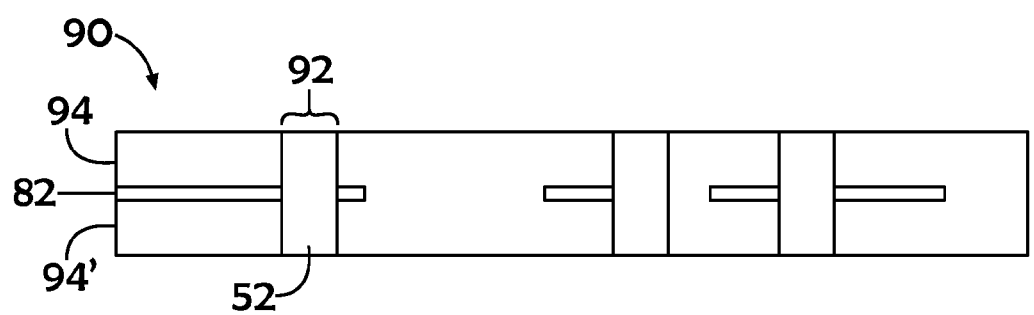
Figure 5A:
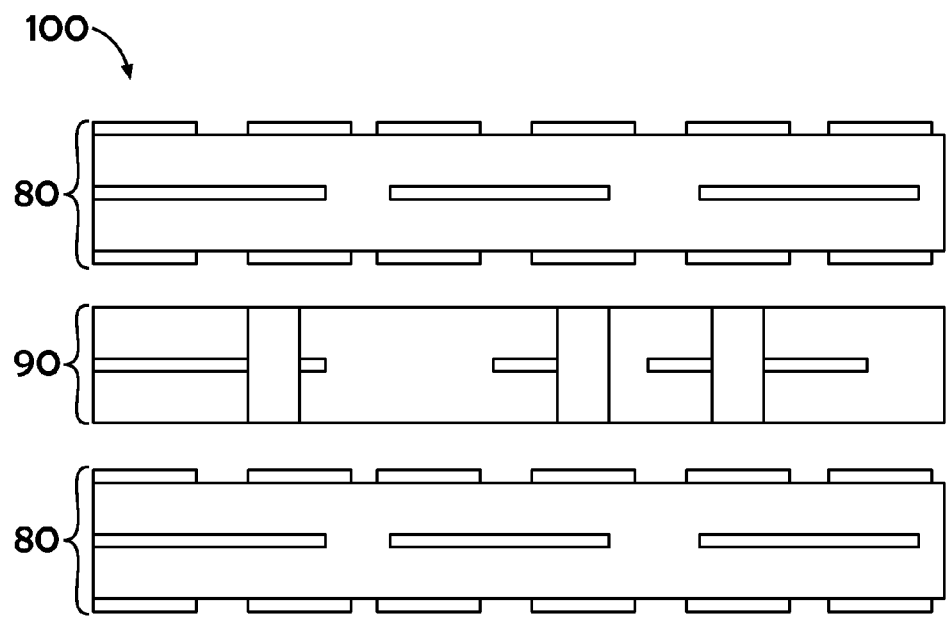
FIGS. 5a-d shows the laminating structure of layer members to form a printed wiring board according to one embodiment of the invention
Figure 5B:
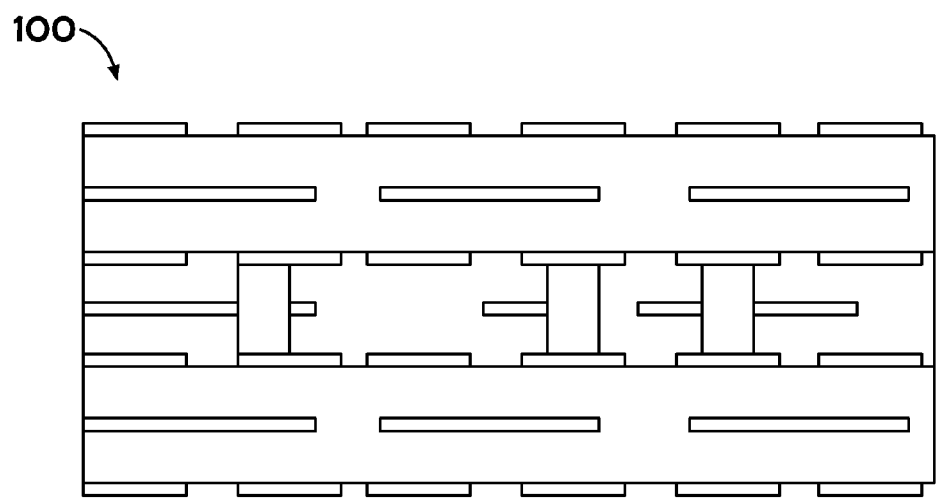
Figure 5C:
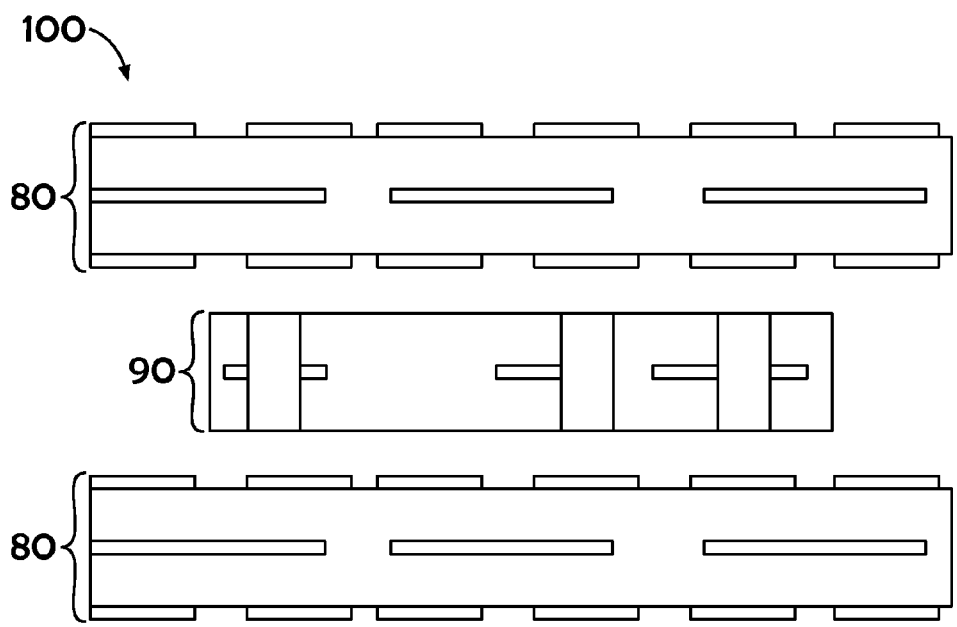
Figure 5D:
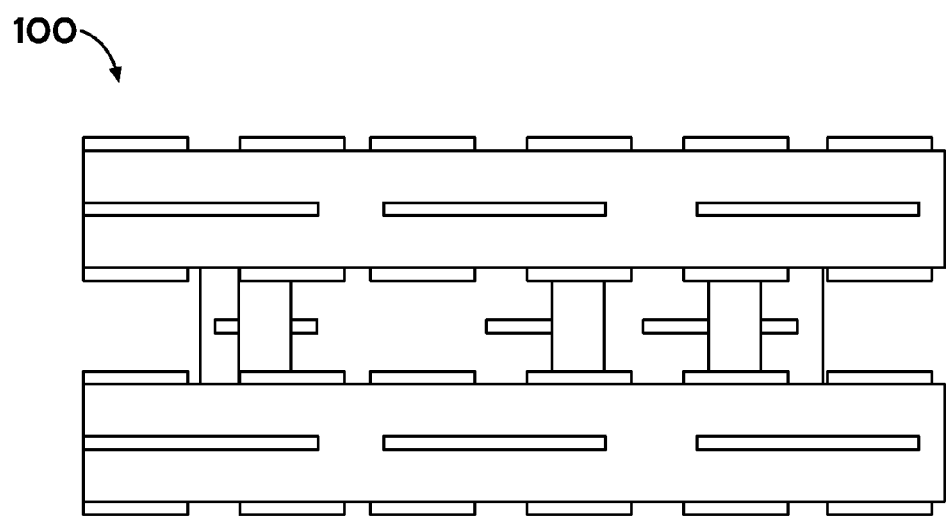

The second building block in this case study is a 0S/1P core 90, as shown in FIG. 4b, also known as a joining core. This core is constructed using a copper power plane 82, 35 µm thick, sandwiched between layers of a dielectric material 94, 94'. Through holes 92 in the core are filled with an electrically conductive adhesive 52. Joining cores 90 were partially cured structure. A 7 metal layer structure 100 as shown in FIGS. 5a-b, with four signal layers can be made with three sub-composites comprising two 2S/1P cores 80 and one 0S/2P core 90. In this structure, the top and bottom 2S/1P layers can be laminated with the 0S/1P layer. In this case, both the top and the bottom 2S/1P layers used will be of LCP. It is also possible for the top dielectric of the top 2S/1P layer and the bottom dielectric of the bottom 2S/1P layer to be LCP and rest of the structure can use different dielectric. Again, the top and bottom 2S/1P can be larger as shown in FIGS. 5c-d than the joining core.

Figure 6A:
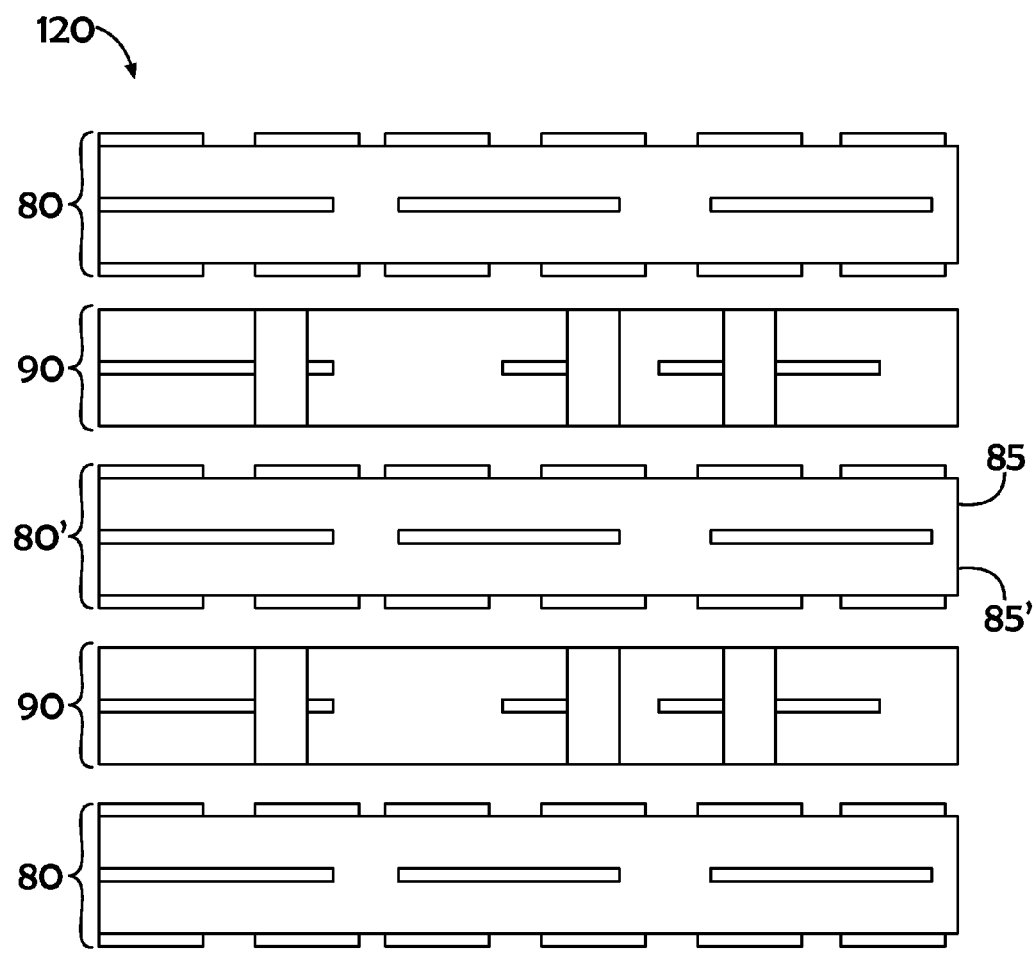
FIGS. 6a-b show the laminating structure of layer members to form a printed wiring board according to one embodiment of the invention
Figure 6B:
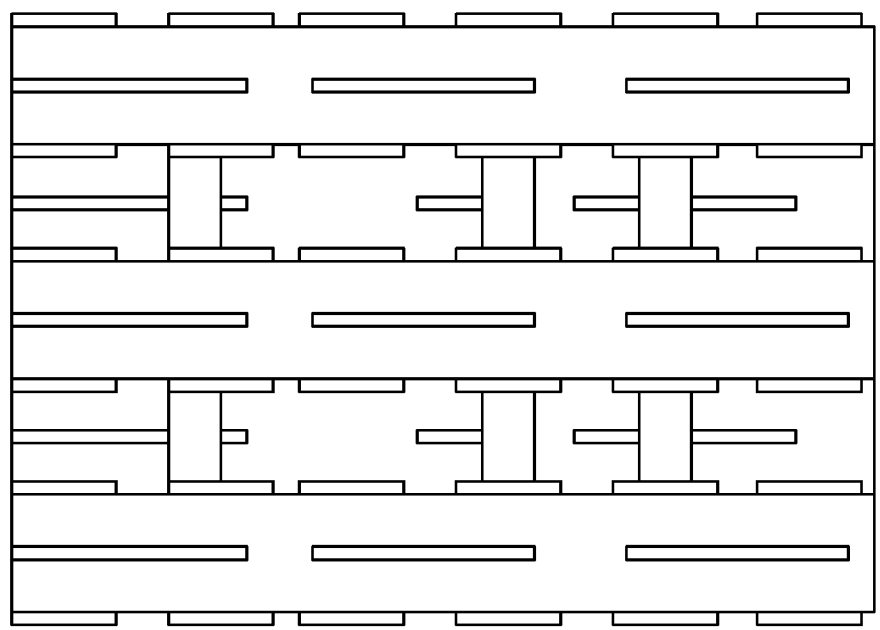

In another example, an 11 metal layer structure 120 as shown in FIGS. 6a-b, with six signal layers can be made with five sub-composites comprising two 2S/1P cores 80 and a third 2S/1P core 80' that uses a different dielectric 85, 85', such as Teflon based materials, and two 0S/2P cores 90. In this example, both the top and the bottom 2S/1P cores 80 will be made with LCP.

Figure 7A:
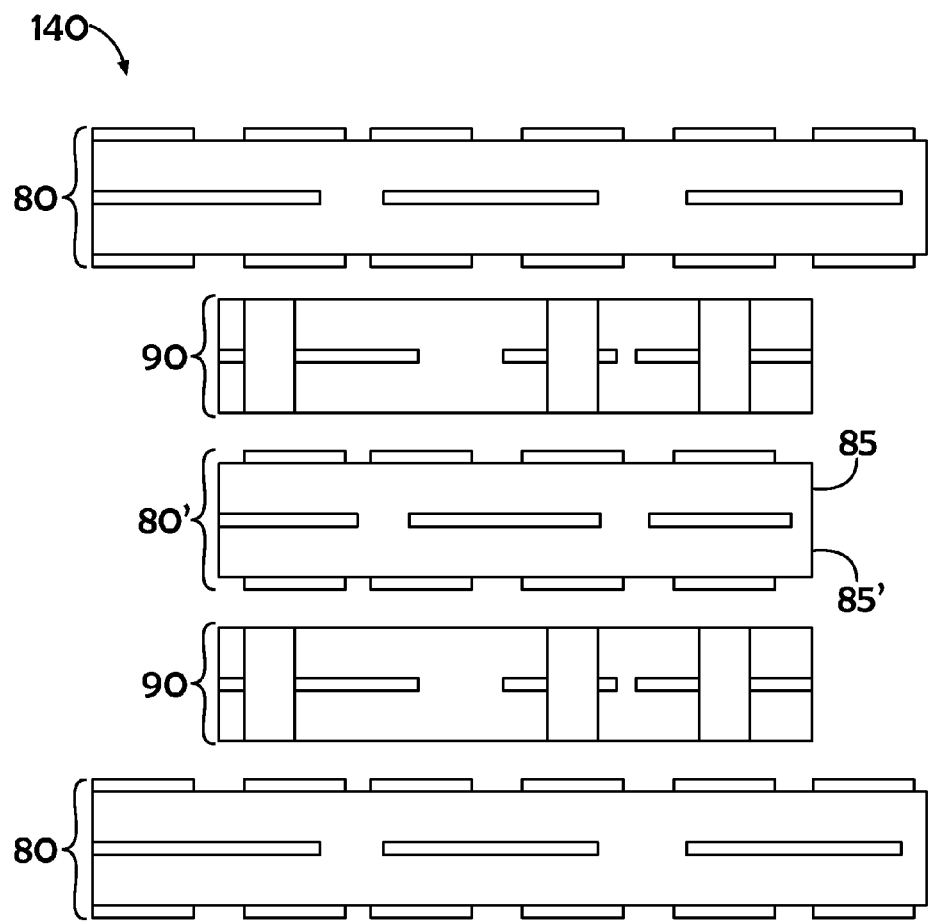
FIGS. 7a-b show the laminating structure of layer members to form a printed wiring board according to one embodiment of the invention.
Figure 7B:
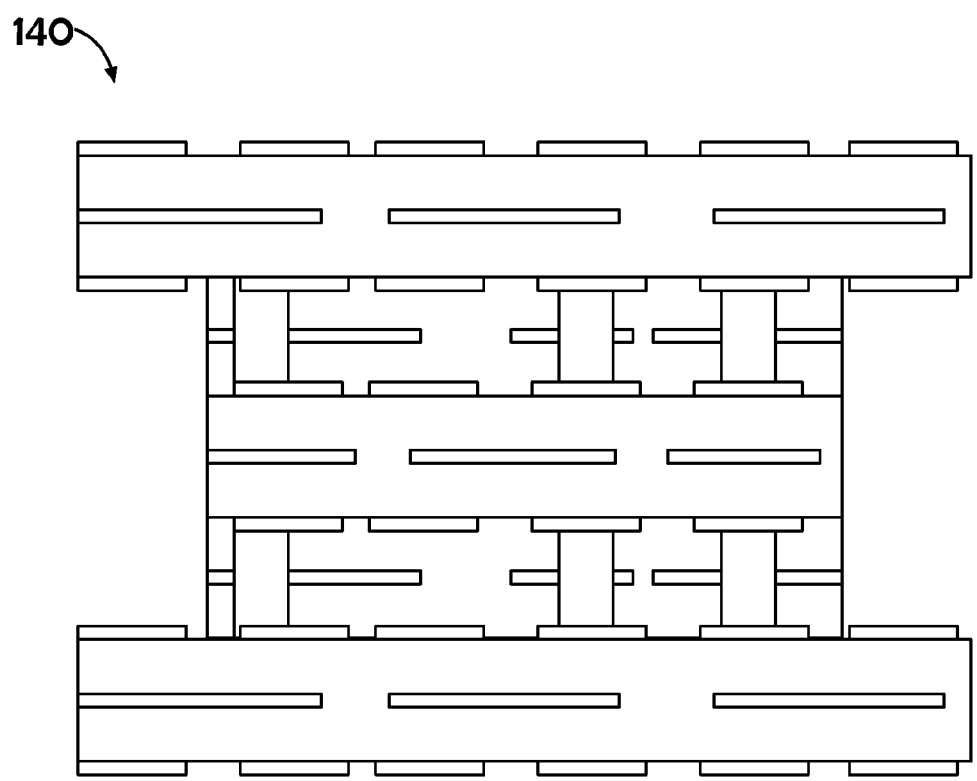
Figure 8A:
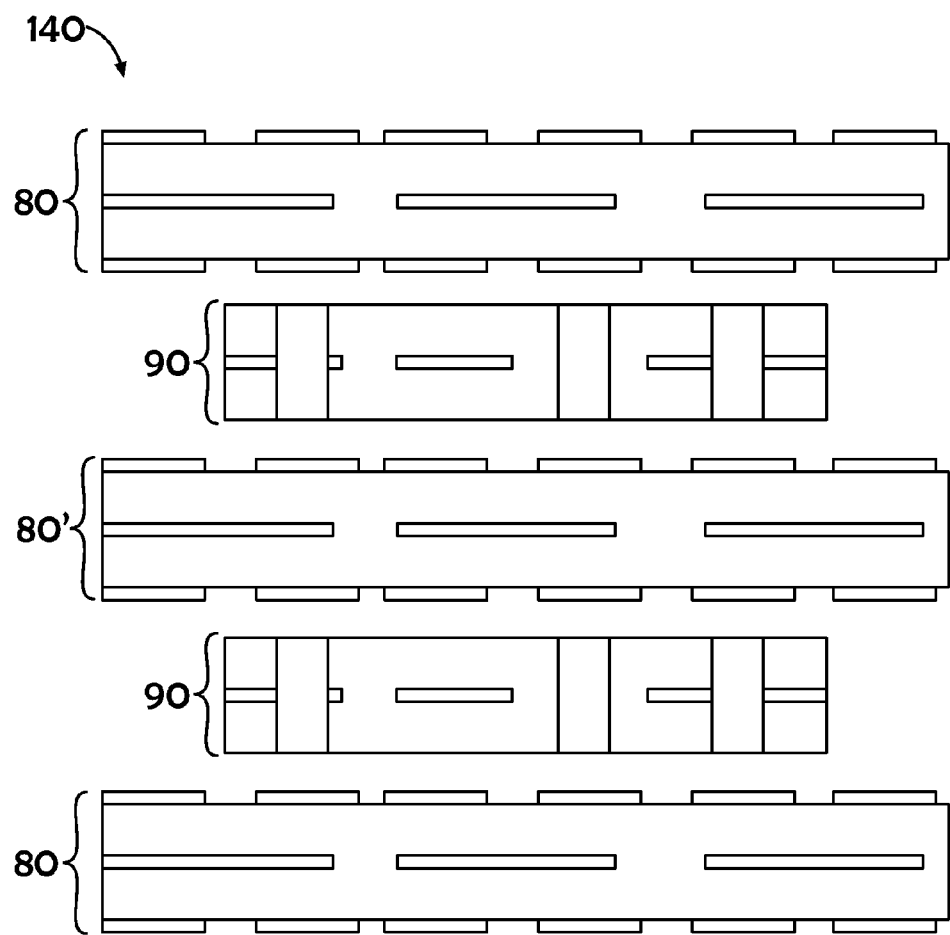
FIGS. 8a-b show the laminating structure of layer members to form a printed wiring board according to one embodiment of the invention It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements among the drawings. In other words, for the sake of clarity and brevity, like elements and components of each embodiment bear the same designations throughout the description.
Figure 8B:
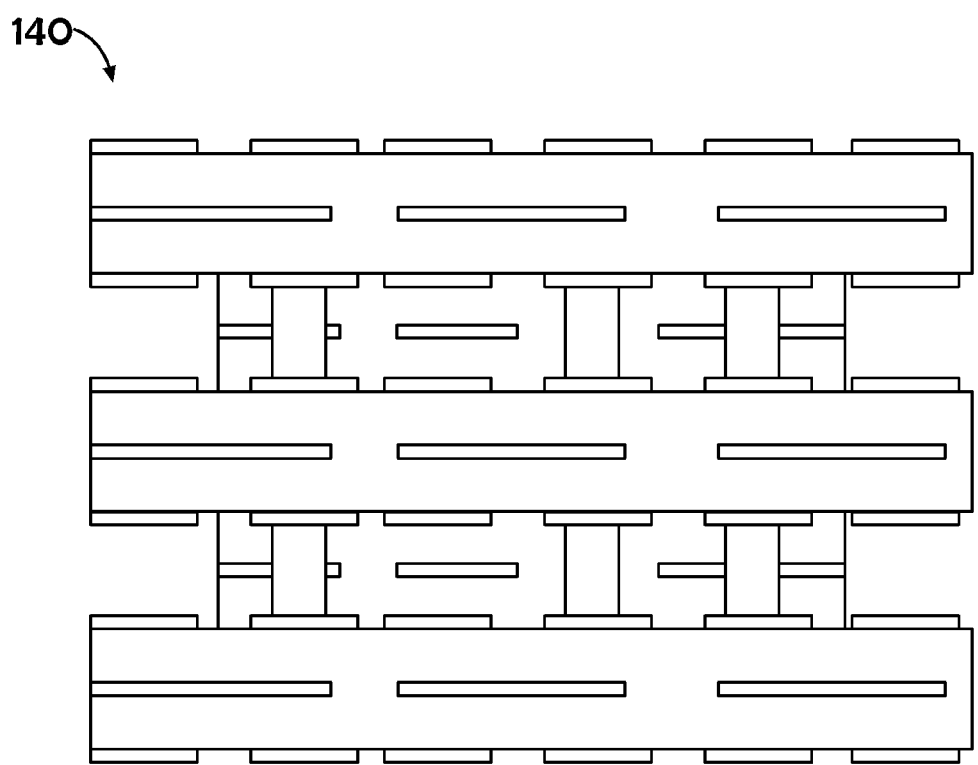

The top and bottom 2S/1P cores can be larger, as shown in FIGS. 7*a-b*, than the joining cores 90 and middle 2S/1P core 80'. In another example, all 2S/1P core structures 80 are larger, as seen in FIGS. 8*a-b*, than the joining cores 90, only if all 2S/1P cores are made with LCP, as shown in FIG. 8*b*. It is also possible to use LCP in the 0S/1P core 90. In one example, all 2S/1P cores are made with a high temperature melting LCP and all 0S/1P cores are made with a low temperature melting LCP.

Although all structures using Z-interconnects utilize electrically conductive adhesives, it also possible to use plated through hole (PTH) and/or a micro via and/or a buried via for electrical connections. All electrical connections, including Z-interconnect, PTH, micro via, and/or buried vias can be used in the above structures.

In another embodiment, LCP can be used as an LCP composite. It can be an LCP based nanocomposite and/or microcomposite. LCP nanocomposites can contain nano particles, nano tubes, and/or nano layers.

Since other modifications and changes to the liquid crystal polymer buildup layer and hermeticity effected as such will be apparent to those skilled in the art, the invention is not considered limited to the description above for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A substrate for use in electronic packages comprising:
    a) a layer of copper-invar-copper (CIC) having an upper surface and a lower surface;
    b) a first layer of polytetrafluoroethylene (PTFE) disposed on said upper surface of said CIC layer;
    c) a second layer of PTFE disposed on said lower surface of said CIC layer;
    d) a top layer of etched copper foil having etched spaces disposed on said upper surface of said first PTFE layer;
    e) a bottom layer of etched copper foil having etched spaces disposed on said lower surface of said second PTFE layer;
    f) a first layer of liquid crystal polymer (LCP) having an upper surface and a lower surface disposed on said top layer of etched copper foil;
    g) a second layer of LCP having an upper surface and a lower surface disposed on said bottom layer of etched copper foil;
    h) a top external layer of etched copper foil disposed on said upper surface of said first and said second LCP layers; and
    i) bottom external layers of etched copper foil disposed on said lower surface of said first LCP layer and said second LCP layer, respectively.

2. The substrate for use in electronic packages based on claim 1, wherein all said layers are laminated.

3. The substrate for use in electronic packages based on claim 1, wherein a portion of said first LCP layer and said second LCP layer is disposed in said etched spaces of said top and said bottom copper foil layers, respectively.

4. The substrate for use in electronic packages based on claim 1, wherein said first and said second layers of LCP comprise aromatic polyester polymers.

5. The substrate for use in electronic packages based on claim 3, wherein said first and said second layers of LCP comprise aromatic polyester polymers.

6. The substrate for use in electronic packages based on claim 1, wherein the dimensions of said first and said second layers of LCP are greater than the dimensions of said CIC layer and than said first and said second layers of PTFE.

7. A method of forming a near hermetically sealed substrate, the steps comprising:
    a) providing a CIC layer;
    b) disposing a first polytetrafluoroethylene (PTFE) layer on an upper surface of said CIC layer;
    c) disposing a second PTFE layer on a lower surface of said CIC layer;
    d) disposing a top copper foil layer on said first PTFE layer;
    e) disposing a bottom copper foil layer on said second PTFE layer;
    f) laminating all of said layers together;
    g) etching said top copper foil layer to create at least a first cavity;
    h) etching said bottom copper foil layer to create at least a second cavity;
    i) disposing a first layer of liquid crystal polymer (LCP) on said top layer of etched copper foil;
    j) disposing a second layer of LCP on said bottom layer of etched copper foil;
    k) disposing an external upper copper foil layer on said first LCP layer;
    l) disposing an external lower copper foil layer on said second LCP layer;
    m) laminating all of said layers together;
    n) etching said external upper layer of copper foil; and
    o) etching said external lower layer of copper foil.

8. The method of forming a near hermetically sealed substrate based on claim 7, wherein a portion of said first LCP layer and said second LCP layer is disposed in said cavities of said top and said bottom copper foil layers, respectively.

9. The method of forming a near hermetically sealed substrate based on claim 8, wherein said first and said second layers of LCP comprise aromatic polyester polymers.

10. The method of forming a near hermetically sealed substrate based on claim 7, wherein said first layer and said second layer of LCP comprise aromatic polyester polymers.

* * * * *